(12) United States Patent
Mizoguchi et al.

(10) Patent No.: US 11,907,103 B2
(45) Date of Patent: Feb. 20, 2024

(54) TEST ENVIRONMENT DETERMINATION DEVICE AND TEST ENVIRONMENT DETERMINATION METHOD

(71) Applicant: HITACHI ASTEMO, LTD., Ibaraki (JP)

(72) Inventors: Masashi Mizoguchi, Tokyo (JP); Takahiro Iida, Tokyo (JP); Toru Irie, Ibaraki (JP); Yoshimi Yamazaki, Ibaraki (JP)

(73) Assignee: HITACHI ASTEMO, LTD., Ibaraki (JP)

( * ) Notice: Subject to any disclaimer, the term of this patent is extended or adjusted under 35 U.S.C. 154(b) by 330 days.

(21) Appl. No.: 17/417,839

(22) PCT Filed: Dec. 12, 2019

(86) PCT No.: PCT/JP2019/048611
§ 371 (c)(1),
(2) Date: Jun. 24, 2021

(87) PCT Pub. No.: WO2020/137566
PCT Pub. Date: Jul. 2, 2020

(65) Prior Publication Data
US 2022/0058113 A1 Feb. 24, 2022

(30) Foreign Application Priority Data
Dec. 27, 2018 (JP) .................. 2018-246057

(51) Int. Cl.
*G06F 11/00* (2006.01)
*G06F 11/36* (2006.01)
(52) U.S. Cl.
CPC ................ *G06F 11/3664* (2013.01)
(58) Field of Classification Search
CPC .................................. G06F 11/3664
(Continued)

(56) References Cited

U.S. PATENT DOCUMENTS

| 7,529,890 B1* | 5/2009 | Neuman | G06F 11/2236 |
| | | | 711/141 |
| 2002/0104046 A1* | 8/2002 | Mohammad | G06F 11/26 |
| | | | 714/E11.159 |

(Continued)

FOREIGN PATENT DOCUMENTS

| JP | 2008-084121 A | 4/2008 |
| WO | 2018/066040 A1 | 4/2018 |

OTHER PUBLICATIONS

International Search Report, PCT/JP2019/048611, dated Mar. 3, 2020, 2 pgs.

*Primary Examiner* — Sarai E Butler
(74) *Attorney, Agent, or Firm* — Volpe Koenig

(57) ABSTRACT

An appropriate test environment is selected while preventing test cases from being detained therein. A test environment determination device includes: an element selection unit that selects one or more test targets and one or more test environments for executing a test case based on target requirements described for specifications of an electronic control unit, which is a test target, and environment requirements described for specifications of a test environment for simulating an external environment of the test target; an environment operation information acquisition unit that acquires operation information on the test environments; and an environment selection unit that selects a combination of the selected test target and the selected test environment based on the acquired operation information.

14 Claims, 18 Drawing Sheets

501

| | OPERATING FREQUENCY | MEMORY AREA SIZE | NUMBER OF I/O PORTS | NUMBER OF COMMUNICATION CHANNELS |
|---|---|---|---|---|
| NO_ECU | INF | INF | INF | INF |
| ECU1 | 1.2GHz | 2GB | 20 | 2 |
| ECU2 | 1.5GHz | 1GB | 10 | 3 |
| ECU3 | 1.0GHz | 5GB | 10 | 1 |

502

| | OPERATING FREQUENCY | MEMORY AREA SIZE | NUMBER OF I/O PORTS | NUMBER OF COMMUNICATION CHANNELS |
|---|---|---|---|---|
| HiLS1 | 1.2GHz | 5GB | 20 | 3 |
| HiLS2 | 1.0GHz | 5GB | 20 | 6 |
| HiLS3 | 1.0GHz | 5GB | 20 | 4 |
| SiLS1 | 1.5GHz | 5GB | 20 | 3 |
| SiLS2 | 1.5GHz | 5GB | 20 | 6 |

(58) Field of Classification Search
USPC .................................................... 714/1–57
See application file for complete search history.

(56) References Cited

U.S. PATENT DOCUMENTS

| | | | |
|---|---|---|---|
| 2004/0250156 A1* | 12/2004 | Weichselbaum | G06F 11/0706 |
| | | | 714/2 |
| 2005/0102580 A1* | 5/2005 | House | G06F 11/2294 |
| | | | 714/38.14 |
| 2006/0174162 A1* | 8/2006 | Varadarajan | G06F 11/263 |
| | | | 714/38.14 |
| 2011/0122879 A1* | 5/2011 | Elmasry | H04L 41/122 |
| | | | 370/401 |
| 2011/0131031 A1* | 6/2011 | Katz | G06F 11/3684 |
| | | | 703/28 |
| 2011/0131449 A1* | 6/2011 | Hess | G06F 11/267 |
| | | | 714/E11.029 |
| 2012/0131385 A1* | 5/2012 | Chin | G06F 11/2284 |
| | | | 714/E11.159 |
| 2013/0080130 A1* | 3/2013 | Behr | G06F 16/21 |
| | | | 703/6 |
| 2015/0019915 A1* | 1/2015 | Kospiah | G06F 21/566 |
| | | | 714/38.1 |
| 2015/0121140 A1* | 4/2015 | Senf | G05B 23/0256 |
| | | | 714/33 |
| 2015/0127985 A1* | 5/2015 | Onoue | G06F 3/0611 |
| | | | 714/33 |

* cited by examiner

|  | OPERATING FREQUENCY | MEMORY AREA SIZE | NUMBER OF I/O PORTS | NUMBER OF COMMUNICATION CHANNELS |
|---|---|---|---|---|
| NO_ECU | INF | INF | INF | INF |
| ECU1 | 1.2GHz | 2GB | 20 | 2 |
| ECU2 | 1.5GHz | 1GB | 10 | 3 |
| ECU3 | 1.0GHz | 5GB | 10 | 1 |

|  | OPERATING FREQUENCY | MEMORY AREA SIZE | NUMBER OF I/O PORTS | NUMBER OF COMMUNICATION CHANNELS |
|---|---|---|---|---|
| HiLS1 | 1.2GHz | 5GB | 20 | 3 |
| HiLS2 | 1.0GHz | 5GB | 20 | 6 |
| HiLS3 | 1.0GHz | 5GB | 20 | 4 |
| SiLS1 | 1.5GHz | 5GB | 20 | 3 |
| SiLS2 | 1.5GHz | 5GB | 20 | 6 |

FIG. 7

701: STORE OPERATING FREQUENCY, MEMORY AREA SIZE, NUMBER OF I/O PORTS, AND NUMBER OF COMMUNICATION CHANNELS AS TARGET REQUIREMENTS IN ENV_spec_req[4] IN ORDER

702: STORE OPERATING FREQUENCY, MEMORY AREA SIZE, NUMBER OF I/O PORTS, AND NUMBER OF COMMUNICATION CHANNELS FOR EACH TEST TARGET AS PERFORMANCE INFORMATION IN ENV_spec_list[5][4] IN ORDER For i=0; i<5; i++

703: If for all j in range(0, 5): ENV_spec_req[j] <= ENV_spec_list[i][j]

YES 704: ENV_choice[i]=TRUE

NO 705: ENV_choice[i]=FALSE

FIG. 8

|  | HiLS1 | HiLS2 | HiLS3 | SiLS1 | SiLS2 |
|---|---|---|---|---|---|
| NO_ECU | 0 | 0 | 0 | 1 | 1 |
| ECU1 | 1 | 1 | 1 | 0 | 0 |
| ECU2 | 0 | 1 | 1 | 0 | 0 |
| ECU3 | 1 | 0 | 0 | 0 | 0 |

| SERIAL NUMBER | TEST CASE ID | START TIME | END TIME |
|---|---|---|---|
| 1 | 001 | 2018/01/01 10:00:00 | 2018/01/01 10:03:00 |
| 2 | 002 | 2018/01/01 10:03:02 | 2018/01/01 10:06:35 |
| 3 | 003 | 2018/01/01 10:06:38 | 2018/01/01 10:10:27 |
| 4 | 101 | 2018/01/01 15:23:01 | 2018/01/01 15:26:31 |

3102

| SERIAL NUMBER | TEST CASE ID | START TIME | END TIME |
|---|---|---|---|
| 1 | 001 | 2018/01/01 10:20:10 | 2018/01/01 10:24:52 |
| 2 | 005 | 2018/01/01 10:24:59 | 2018/01/01 10:28:30 |
| 3 | 102 | 2018/01/01 10:30:52 | 2018/01/01 10:35:17 |
| 4 | 201 | 2018/01/03 07:23:19 | 2018/01/03 07:39:31 |

3103

| SERIAL NUMBER | TEST CASE ID | START TIME | END TIME |
|---|---|---|---|
| 1 | 003 | 2018/01/04 10:00:02 | 2018/01/01 10:03:59 |

3104

| SERIAL NUMBER | TEST CASE ID | START TIME | END TIME |
|---|---|---|---|
| 1 | 001 | 2018/01/02 14:20:04 | 2018/01/02 14:23:01 |
| 2 | 002 | 2018/01/02 14:23:08 | 2018/01/02 14:26:35 |
| 3 | 003 | 2018/01/02 18:06:31 | 2018/01/02 18:10:52 |
| 4 | 101 | 2018/01/02 18:13:01 | 2018/01/02 18:16:47 |

3105

| SERIAL NUMBER | TEST CASE ID | START TIME | END TIME |
|---|---|---|---|
| 1 | 005 | 2018/01/01 10:00:00 | 2018/01/01 10:03:20 |
| 2 | 002 | 2018/01/01 10:03:22 | 2018/01/01 10:06:35 |

FIG. 12

| ENVIRONMENT OF TEST EXECUTED | SERIAL NUMBER | START TIME | END TIME |
|---|---|---|---|
| HiLS1 | 1 | 2018/01/01 10:00:00 | 2018/01/01 10:03:00 |
| HiLS1 | 2 | 2018/01/01 10:03:02 | 2018/01/01 10:06:35 |
| HiLS1 | 3 | 2018/01/01 10:06:38 | 2018/01/01 10:10:27 |
| HiLS3 | 1 | 2018/01/04 10:00:02 | 2018/01/01 10:03:59 |
|  |  |  |  |

901

TEST ENVIRONMENT DETERMINATION DEVICE AND TEST ENVIRONMENT DETERMINATION METHOD

TECHNICAL FIELD

The present invention relates to a test environment determination device.

BACKGROUND ART

Various test environments have been introduced to efficiently test large-scale software, but the increase in test environment options makes it difficult to manually determine a test environment. The following prior art is a background art in this technical field. PTL 1 (JP 2008-84121 A) describes a simulation system including a plurality of slave management devices that manages environmental conditions of simulations in a plurality of corresponding simulators that executes predetermined simulations, and a master management device that is connected to each of the slave management devices via a network and collectively manages the environmental conditions of simulations in the plurality of simulators through the slave management devices.

CITATION LIST

Patent Literature

PTL 1: JP 2008-84121 A

SUMMARY OF INVENTION

Technical Problem

In the simulation system described in PTL 1, a test environment is automatically determined, with electronic control units (ECUs) presented as test targets and hardware-in-the-loop simulators (HiLSs) and software-in-the-loop simulators (SiLSs) presented as test environments. The master management device collectively manages the environmental conditions for each of the HiLSs and the SiLSs, including setting conditions defining information on types and units of data, accuracy, data arrangement, etc. required for executing and evaluating a simulation, setting conditions of a graphical user interface (GUI) for controlling a simulation on a display unit of the slave management device, and the like. Thus, when an operator specifies environmental conditions, a highest simulation-accuracy simulator satisfying the specified environment conditions can be automatically selected. However, the high simulation-accuracy simulator is intensively selected, resulting in a problem with tests of ECUs, which should be tested through a large number of test cases in limited test environments, in that test cases are detained in a specific HiLS having high simulation accuracy.

Therefore, an object of the present invention is to prevent test cases from being detained.

Solution to Problem

A typical example of the invention disclosed in the present application is as follows. That is, a test environment determination device includes: an element selection unit that selects one or more test targets and one or more test environments for executing a test case based on target requirements described for specifications of an electronic control unit, which is a test target, and environment requirements described for specifications of a test environment for simulating an external environment of the test target; an environment operation information acquisition unit that acquires operation information on the test environments; and an environment selection unit that selects a combination of the selected test target and the selected test environment based on the acquired operation information.

Advantageous Effects of Invention

According to one aspect of the present invention, an appropriate test environment can be selected while preventing test cases from being detained therein. Other problems, configurations, and effects that are not described above will be apparent from the following description of embodiments.

BRIEF DESCRIPTION OF DRAWINGS

FIGS. 5A-B are a diagram showing performance information stored in a performance information storage unit in the first embodiment.

FIG. 7 is a flowchart of a process in which the element selection unit selects test environments based on environment requirements and environment performance information in the first embodiment.

FIG. 8 is a diagram showing a combination availability table stored in a combination availability information storage unit in the first embodiment.

FIG. 10 is a diagram showing operation information on each HiLS and each SiLS acquired by an environment operation information acquisition unit in the first embodiment.

FIG. 12 is a diagram showing a usage status table for ECUs in the first embodiment.

DESCRIPTION OF EMBODIMENTS

A test environment determination device disclosed as an embodiment of the present invention is particularly suitable for application to a test technique used for developing software for controlling an embedded system. Hereinafter, embodiments of the present invention will be described.

First Embodiment

<Configuration>

Figure 1:
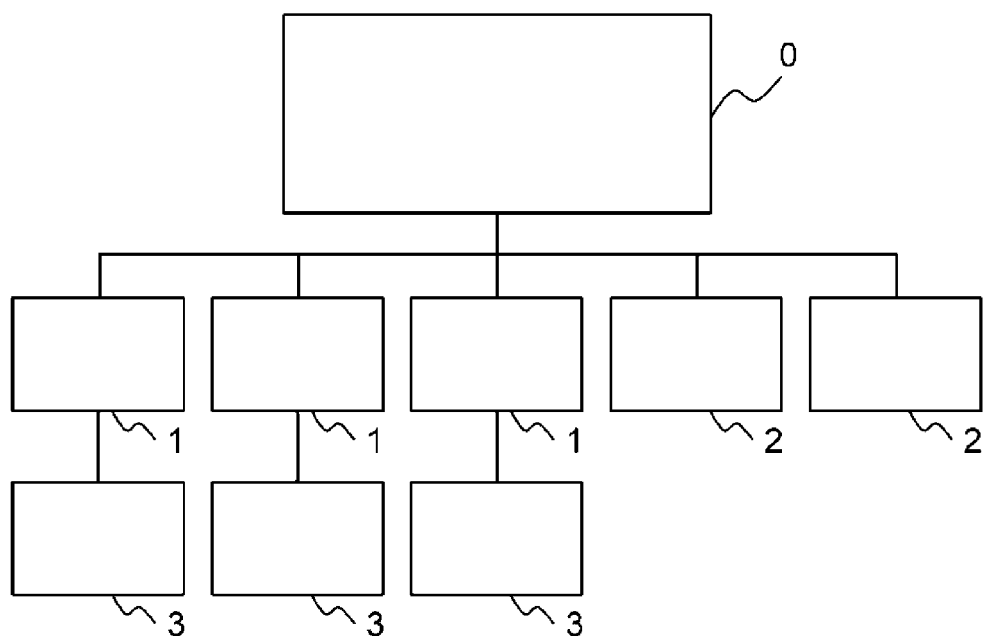
FIG. 1 is a diagram showing a configuration of a system including a test environment determination device in a first embodiment.

FIG. 1 is a diagram showing a configuration of a system including a test environment determination device 0 in this embodiment. The system as illustrated includes a test environment determination device 0, three hardware-in-the-loop simulator (HiLS) environments 1, and two software-in-the-loop simulator (SiLS) environments 2. Each of the HiLS environments 1 is connected to the test environment determination device 0, and each of the SiLS environments 2 is connected to the test environment determination device 0. In addition, each of the HiLS environments 1 is connected to an ECU 3. In this embodiment, the number of HiLS environments 1 is three and the number of SiLS environments 2 is two, but the respective numbers of HiLS environments 1 and SiLS environments 2 are not limited thereto, and may be singular or arbitrarily plural.

The ECU 3, which is an electronic control unit mainly used for controlling a vehicle, executes a controlling process related to the vehicle such as vehicle travel by executing a program through a processor.

<HiLS Environment and SiLS Environment>

Figure 2A:
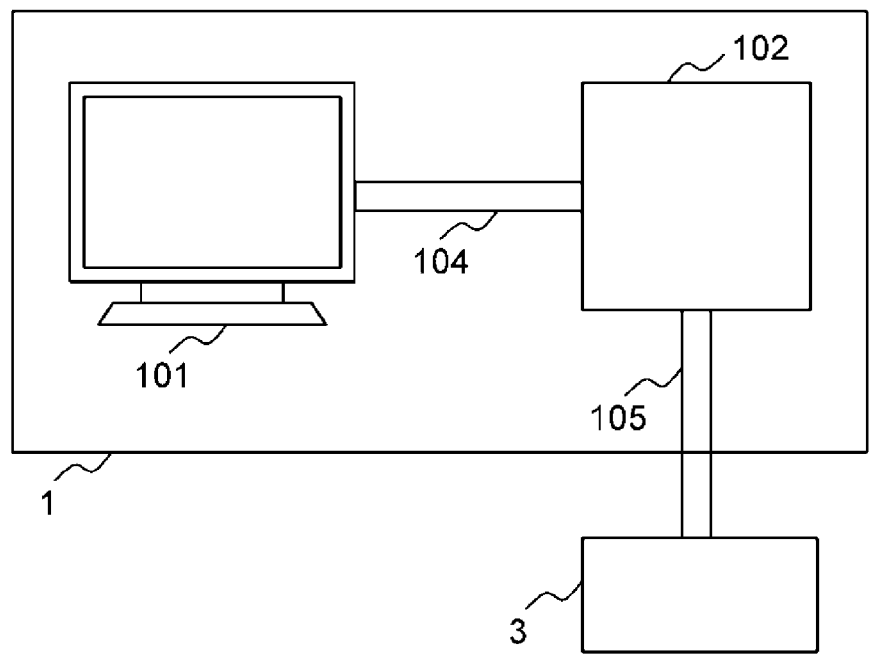
FIGS. 2A-B are a diagram showing configurations of a HiLS environment and a SiLS environment in the first embodiment.
Figure 2B:
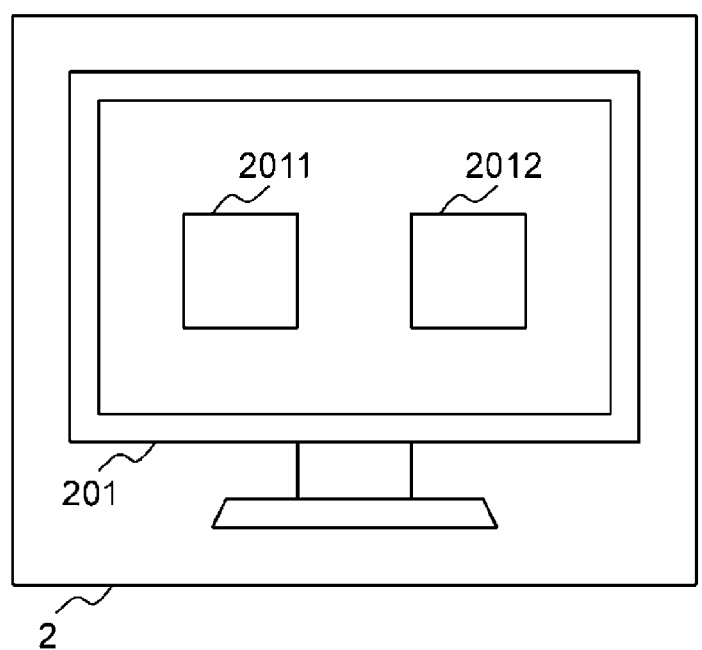

FIGS. 2A-B are a diagram showing configurations of the HiLS environment 1 and the SiLS environment 2.

As shown in FIG. 2A, the HiLS environment 1 includes a HiLS control computer 101 and a hardware-in-the-loop simulator (HiLS) 102. The ECU 3 is connected to the HiLS 102. The HiLS control computer 101 and the HiLS 102 are connected to each other by a communication path 104, and data is exchanged therebetween via the communication path 104. The communication path 104 is implemented by, for example, a local area network (LAN). The HiLS 102 and the ECU 3 are connected to each other by a communication path 105, and data is exchanged therebetween via the communication path 105. The communication path 105 is implemented by, for example, a controller area network (CAN), but may be implemented by an electric wire to which an input/output signal is applied, or may be implemented by both the network and the electric wire.

As shown in FIG. 2B, the SiLS environment 2 includes a SiLS control computer 201 by which a software-in-the-loop simulator (SiLS) is implemented. The SiLS control computer 201 includes an ECU simulator 2011 simulating the ECU on software and an external environment simulator 2012 simulating an external environment of the ECU 3 on software.

Although not illustrated in terms of hardware configuration, each of the HiLS control computer 101 and the SiLS control computer 201 in this embodiment is constituted by a computer system including a processor (an arithmetic device such as a CPU), a storage device, and a communication interface.

The processor executes a program stored in a memory. A part or all of the process executed by the processor may be executed by an arithmetic device (ASIC, FPGA, or the like) configured as hardware. The memory includes a ROM, which is a non-volatile storage element, and a RAM, which is a volatile storage element. The ROM stores therein an unchangeable program (e.g. BIOS) and the like. The RAM, which is a high-speed and volatile storage element such as a dynamic random access memory (DRAM), temporarily stores therein a program to be executed by the processor and data to be used when the program is executed.

The storage device is, for example, a large-capacity and non-volatile storage device such as a magnetic storage device (HDD) or a flash memory (SSD). The storage device stores therein data to be accessed when the program is executed. In addition, the storage device may also store therein a program to be executed by the processor. In this case, the program is read out from the storage device, loaded into the memory, and then executed by the processor.

The program to be executed by the CPU is provided to the HiLS control computer 101 and the SiLS control computer 201 via a removable medium (a CD-ROM, a flash memory, or the like) or a network, and is stored in a non-volatile storage device that is a non-temporary storage medium. Thus, the computer system may have an interface for reading data thereinto from the removable medium.

<Test Specification Form 30>

Figure 3:
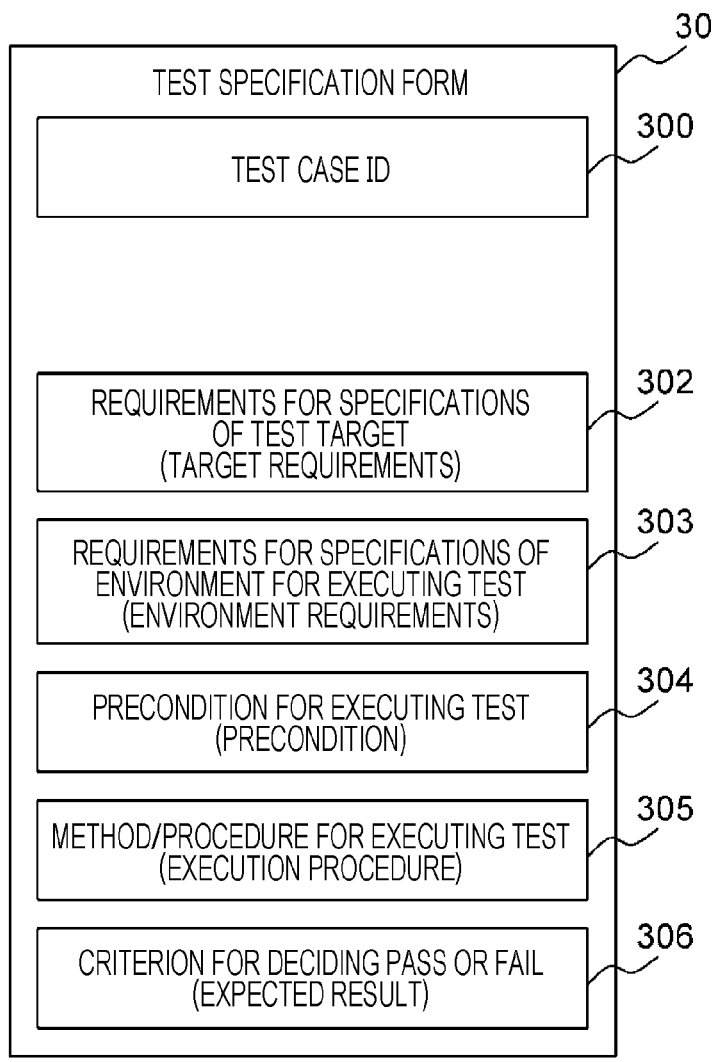
FIG. 3 is a diagram showing a format for a test specification form in the first embodiment.

FIG. 3 is a diagram showing a format for a test specification form 30 in the first embodiment. In the test specification form 30, specifications for each test case are recorded, including a test case ID 300, target requirements 302, environment requirements 303, a precondition 304, an execution procedure 305, and an expected result 306.

One test case corresponds to one test specification form 30. The test case ID 300 is identification information uniquely allocated for one test case, and is also information for identifying a test specification form 30. The target requirements 302 are requirements described for specifications that a test target needs to satisfy, e.g. a lowest operating frequency, a minimum memory area amount, a minimum number of I/O ports, and a required number of communication channels for the ECU, and specified by lower limit values or ranges of these items. The environment requirements 303 are requirements described for specifications that a test environment needs to satisfy, e.g. a lowest operating frequency, a minimum memory area amount, a minimum number of I/O ports, and a required number of communication channels for the HiLS 102 constituting the test environment, and specified by lower limit values or ranges of these items. The precondition 304 is a precondition given for executing a test. For example, an initial value of the random access memory (RAM) in the ECU is specified. The execution procedure 305 is a method or procedure given for executing a test. For example, a timing at which the external environment simulator 2012 for the ECU to be tested sends a controller area network (CAN) message to the ECU is specified. The expected result 306 is a criterion given for deciding the test case as pass or fail. For example, if a specific RAM value matches a predetermined value after receiving the CAN message, the test case is decided as pass. Otherwise, the test case is decided as fail.

<Test Environment Determination Device 0>

Figure 4:
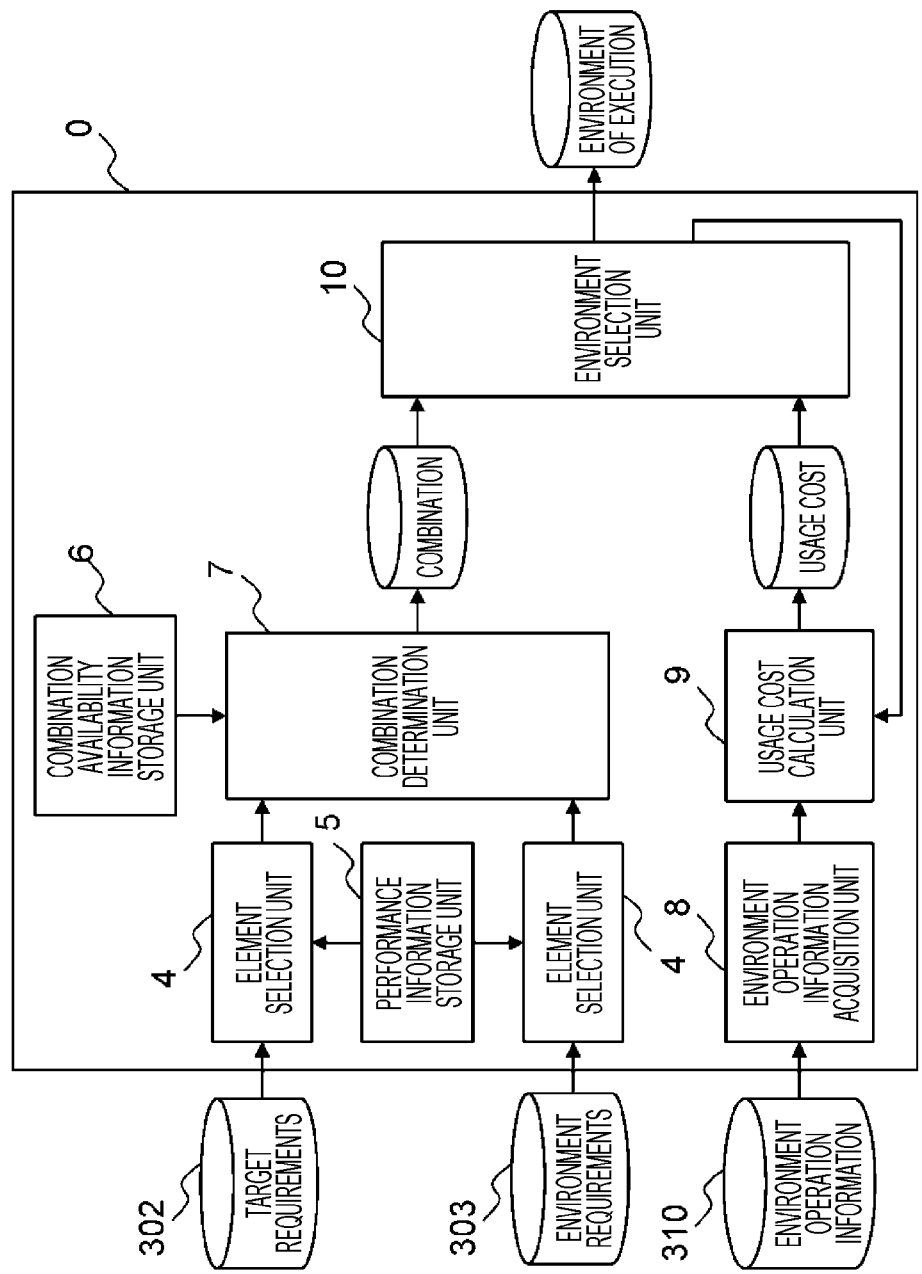
FIG. 4 is a diagram showing a configuration of the test environment determination device in the first embodiment.

FIG. 4 is a diagram showing a configuration of the test environment determination device 0 in the first embodiment. The test environment determination device 0 includes an element selection unit 4, a performance information storage unit 5, a combination availability information storage unit 6, a combination determination unit 7, an environment operation information acquisition unit 8, a usage cost calculation unit 9, and an environment selection unit 10.

The element selection unit 4 acquires the target requirements 302 or the environment requirements 303, compares the acquired requirements with performance information on each test target or each test environment stored in the performance information storage unit 5, and selects one or more selectable test targets or test environments based on the target requirements 302 or the environment requirements 303. The combination availability information storage unit 6 stores therein information on whether combinations of the test targets and the test environments are available. A detailed configuration of the combination availability information storage unit 6 will be described below with reference to FIG. 8. With respect to the test environments and the test targets selected by the element selection unit 4, the combination determination unit 7 outputs a plurality of available combinations of the test targets and the test environments based on the combination availability information. The environment operation information acquisition unit 8 acquires operation information on each of the HiLS environments and the SiLS environments included in the test environments. The usage cost calculation unit 9 calculates costs for using the environments based on the acquired operation information. With respect to the combinations of the test targets and the test environments output by the combination determination unit 7, the environment selection unit 10 selects and outputs one combination with the lowest usage cost calculated by the usage cost calculation unit 9.

<Performance Information Storage Unit 5>

FIGS. 5A-B are a diagram showing the performance information stored in the performance information storage unit 5. The performance information includes target performance information 501 and environment performance information 502. As shown in FIG. 5A, the target performance information 501 is information about each test target such as an ECU, including an operating frequency, a memory area size, the number of I/O ports, and the number of communication channels. As shown in FIG. 5B, the environment performance information 502 is information about each test environment, including an operating frequency, a memory area size, the number of I/O ports, and the number of communication channels. The target performance information 501 and the environment performance information 502 may not include some or all of the data items illustrated, and may include other data items that are not illustrated.

In FIG. 5A, it should be noted that NO_ECU is dummy data used when a SiLS is selected, and each normal information value thereof is undefined.

<Element Selection Unit 4>

Figure 6:
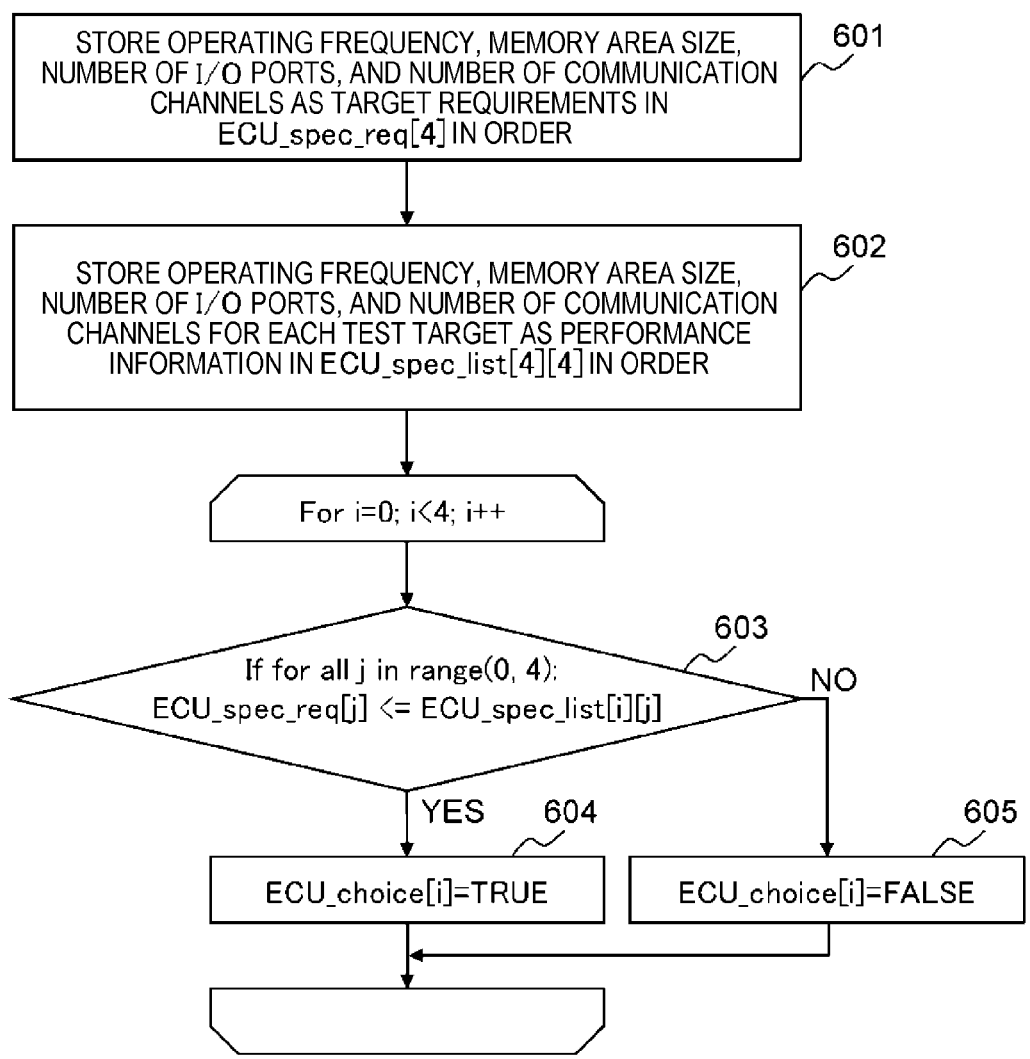
FIG. 6 is a flowchart of a process in which an element selection unit selects test targets based on target requirements and target performance information in the first embodiment.

FIG. 6 is a flowchart of a process in which the element selection unit 4 selects one or more test targets based on the target requirements 302 and the target performance information 501 in the first embodiment.

Information on whether or not each of the test targets can be selected is stored in array ECU_choice[4] with 4 elements. An operating frequency, a memory area size, the number of I/O ports, and the number of communication channels as target requirements 302 are stored in array ECU_spec_req[4] with 4 elements in order. For example, the memory area size as a target requirement 302 is stored in array element ECU_spec_req[1] (601).

The performance information (an operating frequency, a memory area size, the number of I/O ports, the number of communication channels, and the like) for each of the test targets is stored in two-dimensional array ECU_spec_list[4][4] with 16 elements in order. For example, the number of I/O ports of ECU2 and the number of communication channels of ECU2 are stored in array elements ECU_spec_list[2][2] and ECU_spec_list[2][3], respectively. When a SiLS is selected, NO_ECU, which is dummy data, is stored in array elements ECU_spec_list[0][0] to ECU_spec_list[0][3] (602).

Next, data in each row of the array ECU_spec_list[4] [4] is compared with that in the array ECU_spec_req[4] to decide whether values of the operating frequency, the memory area size, the number of I/O ports, and the number of communication channels are equal to or greater than the respective target requirements (603). If all the values of the operating frequency, the memory area size, the number of I/O ports, and the number of communication channels are equal to or greater than the respective target requirements, a value of ECU_choice[i] is TRUE (604). On the other hand, if at least one of the values of the operating frequency, the memory area size, the number of I/O ports, and the number of communication channels is smaller than the respective target requirement 302, a value of ECU_choice[i] is FALSE (605). Thus, a test target whose value of ECU_choice [i] is TRUE is a selectable test target.

FIG. 7 is a flowchart of a process in which the element selection unit 4 selects one or more test environments based on the environment requirements 303 and the environment performance information 502 in the first embodiment.

Information on whether or not each of the test targets can be selected is stored in array ENV_choice[5] with 5 elements. An operating frequency, a memory area size, the number of I/O ports, and the number of communication channels as target requirements 302 are stored in array ENV_spec_req[4] with 4 elements in order. For example, the memory area size as an environment requirement 303 is stored in array element ENV_spec_req[1] (701).

The performance information (an operating frequency, a memory area size, the number of I/O ports, the number of communication channels, and the like) for each of the test environments is stored in two-dimensional array ENV_spec_list[5][4] with 20 elements in order. For example, the number of I/O ports of HiLS2 and the number of communication channels of SiLS1 are stored in array elements ENV_spec_list[1][2] and ENV_spec_list[3][3], respectively (702).

Next, data in each row of the array ENV_spec_list[5] [4] is compared with that in the array ENV_spec_req[4] to decide whether values of the operating frequency, the memory area size, the number of I/O ports, and the number of communication channels are equal to or greater than the respective target requirements (703). If all the values of the operating frequency, the memory area size, the number of I/O ports, and the number of communication channels are equal to or greater than the respective target requirements, a value of ENV_choice[i] is TRUE (704). On the other hand, if at least one of the values of the operating frequency, the memory area size, the number of I/O ports, and the number of communication channels is smaller than the respective target requirement 302, a value of ENV_choice[i] is FALSE (705). Thus, a test target whose value of ENV_choice[i] is TRUE is a selectable test target.

<Combination Availability Information Storage Unit 6>

FIG. 8 is a diagram showing a combination availability table 801 stored in the combination availability information storage unit 6 in the first embodiment. The combination availability table 801 shown in FIG. 8 indicates whether combinations of the test targets and the test environments are available, the test targets being arranged in a vertical direction and the test environments being arranged in a horizontal direction.

If a combination of a test target and a test environment is available, 1 is recorded, and if a combination of a test target and a test environment is not available, 0 is recorded. For example, HiLS1 can be combined with ECU1 or ECU 3. Since a SiLS uses the ECU simulator 2011, the SiLS is not combined with an actual ECU. Therefore, in the combination availability table 801, it is expressed that the SiLS can be combined with NO_ECU which is dummy data.

<Combination Determination Unit 7>

Figure 9:
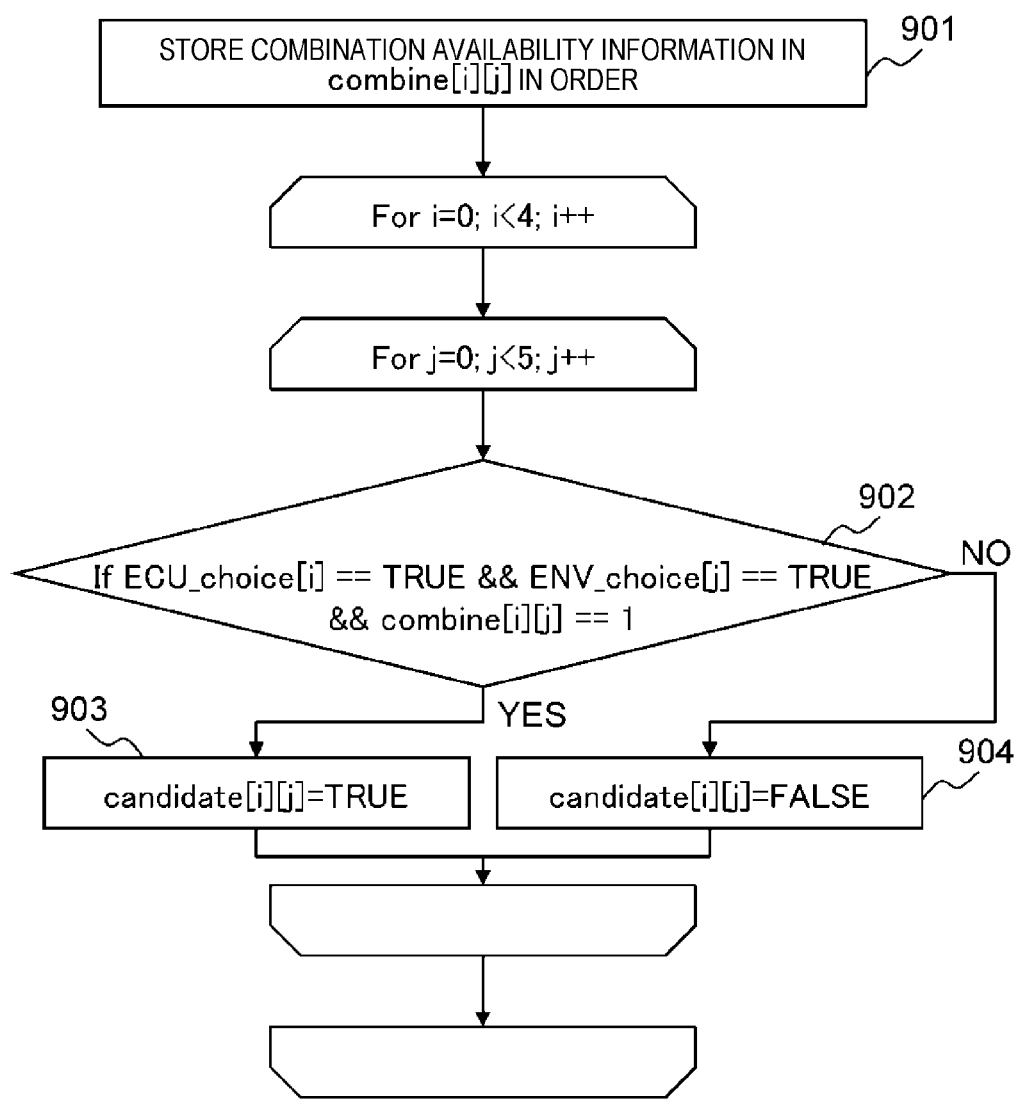
FIG. 9 is a flowchart of a process in which the combination determination unit determines whether or not combinations of the test targets and the test environments selected by the element selection unit are available in the first embodiment.

FIG. 9 is a flowchart of a process in which the combination determination unit 7 determines whether or not combinations of the test targets and the test environments selected by the element selection unit 4 are available in the first embodiment.

Information on whether or not each of the test targets can be selected is stored in two-dimensional array candidate[4][5] with 20 elements. The combination availability information stored in the combination availability information storage unit 6 is stored in advance in the two-dimensional array combine[4][5] with 20 elements in order (901). For example, in array element combine[1][0], which indicates whether ECU1' and HiLS1 can be combined, 1 is stored because they can be combined. In addition, in combine[3][3], which indicates information on whether ECU 3 and SiLS1 can be combined, 0 is stored because they cannot be combined.

A value stored in candidate[i][j] is determined by deciding a value of ECU_choice[i], a value of ENV_choice[j], and a value of combine[i][j] (902). If ECU_choice[i] is TRUE, ENV_choice[j] is TRUE, and combine[i][j] is 1, the value of candidate[i][j] is TRUE (903). Otherwise, the value of candidate[i][j] is FALSE (904).

Thus, candidate[i][j] is TRUE only when a combination of a test target and a test environment is available while both the target requirements 302 and the environment requirements 303 are satisfied. Therefore, a combination whose candidate[i][j] value is TRUE is output as a selectable combination.

<Environment Operation Information Acquisition Unit 8>

FIG. 10 is a diagram showing operation information on each of the HiLSs and the SiLSs acquired by the environment operation information acquisition unit 8 in the first embodiment. The operation information illustrated includes serial numbers indicating the number of test cases executed in each of the test environments, IDs of the executed test cases, execution start times of the respective test cases, and execution end times of the respective test cases. The operation information may not include some of the data items illustrated, and may include other data items that are not illustrated. As illustrated, the operation information includes operation information for each of the HiLSs and SiLSs, that is, operation information 3101 on HiLS1, operation information 3102 on HiLS2, operation information 3103 on HiLS3, operation information 3104 on SiLS1, and operation information 3105 on SiLS2.

<Usage Cost Calculation Unit 9>

Figure 11:
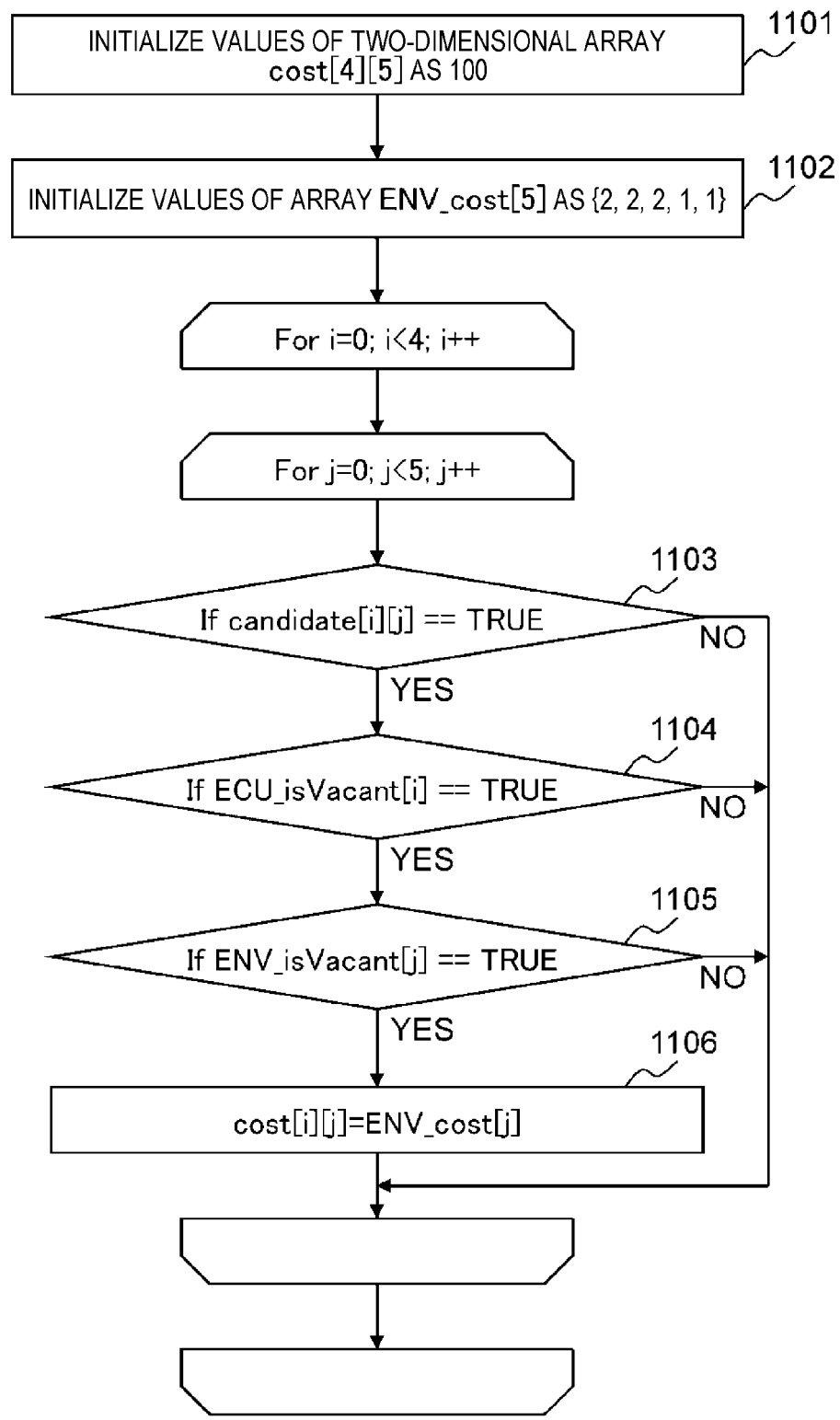
FIG. 11 is a flowchart of a process in which a usage cost calculation unit calculates usage costs in the first embodiment.

FIG. 11 is a flowchart of a process in which the usage cost calculation unit 9 calculates usage costs in the first embodiment. The usage cost calculation unit 9 stores usage costs for the combinations of the test targets and the test environments in two-dimensional array cost[4][5].

First, the usage cost calculation unit 9 initializes values of the two-dimensional array cost[4][5] as 100 (1101).

Next, costs for the test environments are stored in array ENV_cost[5] with 5 elements. In this case, values of the costs are 2, 2, 2, 1, and 1 in order (1102). By setting the usage cost for the SiLSs to be lower than that for the HiLSs as described above, when both a SiLS and a HiLS are vacant, allocation can be made preferentially to the SiLS.

A value stored in cost[i][j] is determined by deciding whether candidate[i][j] is TRUE, the ECU is available, and whether the test environment is available (1103 to 1105). If candidate[i][j] is TRUE, the ECU is currently available, and the test environment is currently available (YES in all of 1103 to 1105), the value of cost[i][j] is updated to a value of ENV_cost[j] (1106).

Here, ECU_isVacant[i] is a function returning TRUE when an ECU corresponding to data in an i-th row of the target performance information 501 stored in the performance information storage unit 5 (hereinafter referred to as i-th ECU) is not currently in operation (that is, vacant) and returning FALSE when the i-th ECU is currently in operation. In addition, ENV_isVacant[j] is a function returning TRUE when a test environment corresponding to data in a j-th row of the environment performance information 502 stored in the performance information storage unit 5 (hereinafter referred to as j-th test environment) is not currently in operation (that is, vacant) and returning FALSE when the j-th test environment is currently in operation.

Concerning whether or not the j-th test environment is currently in operation, the j-th test environment can be decided as being currently in operation when a start time of a last-executed test case is recorded but an end time thereof is not recorded in an operation log of the j-th test environment, and the j-th test environment can be decided as being vacant (not currently in operation) when the start time and the end time of the last-executed test case are recorded therein.

Whether or not the i-th ECU is currently in operation can be decided by the following method. In order to decide the usage status of the i-th ECU by calculation, a usage status table 901 for the i-th ECU including four columns is created as shown in FIG. 12. When the environment selection unit 10 selects the i-th ECU, a HiLS to be tested and a serial number of the HiLS are recorded in the last row of the usage status table 901. It should be noted that an ID of the test case may also be recorded. For example, when the environment selection unit 10 determines a test case of test case ID 301 to be executed for the second ECU in the second test environment, HiLS2 is recorded as an environment of the test to be executed and 5, which is obtained by adding 1 to the last serial number recorded in the operation log of HiLS2, i.e. 4, is recorded as a serial number in the usage status table 901 for the second ECU, while leaving its start time and end time blank.

After the start time of the test case in serial number 5 is recorded in the operation log of HiLS2, the start time is recorded in the usage status table 901 for the second ECU. Likewise, after the end time of the test case in serial number 5 is recorded in the operation log of HiLS2, the end time is recorded in the usage status table 901 for the second ECU. In this way, a usage status table 901 is created for each of the ECUs. It should be noted that for the dummy ECU (NO_ECU), a usage status table 901 may be created in an entirely blank state. Thus, concerning whether or not an i-th ECU is currently in operation, the i-th ECU can be decided as being currently in operation when a start time of a last-executed test case is recorded but an end time thereof is not recorded in a usage status table 901 for the i-th ECU, and the i-th ECU can be decided as being vacant (not currently in operation) when the start time and the end time of the last-executed test case are recorded therein.

<Environment Selection Unit 10>

Figure 13:
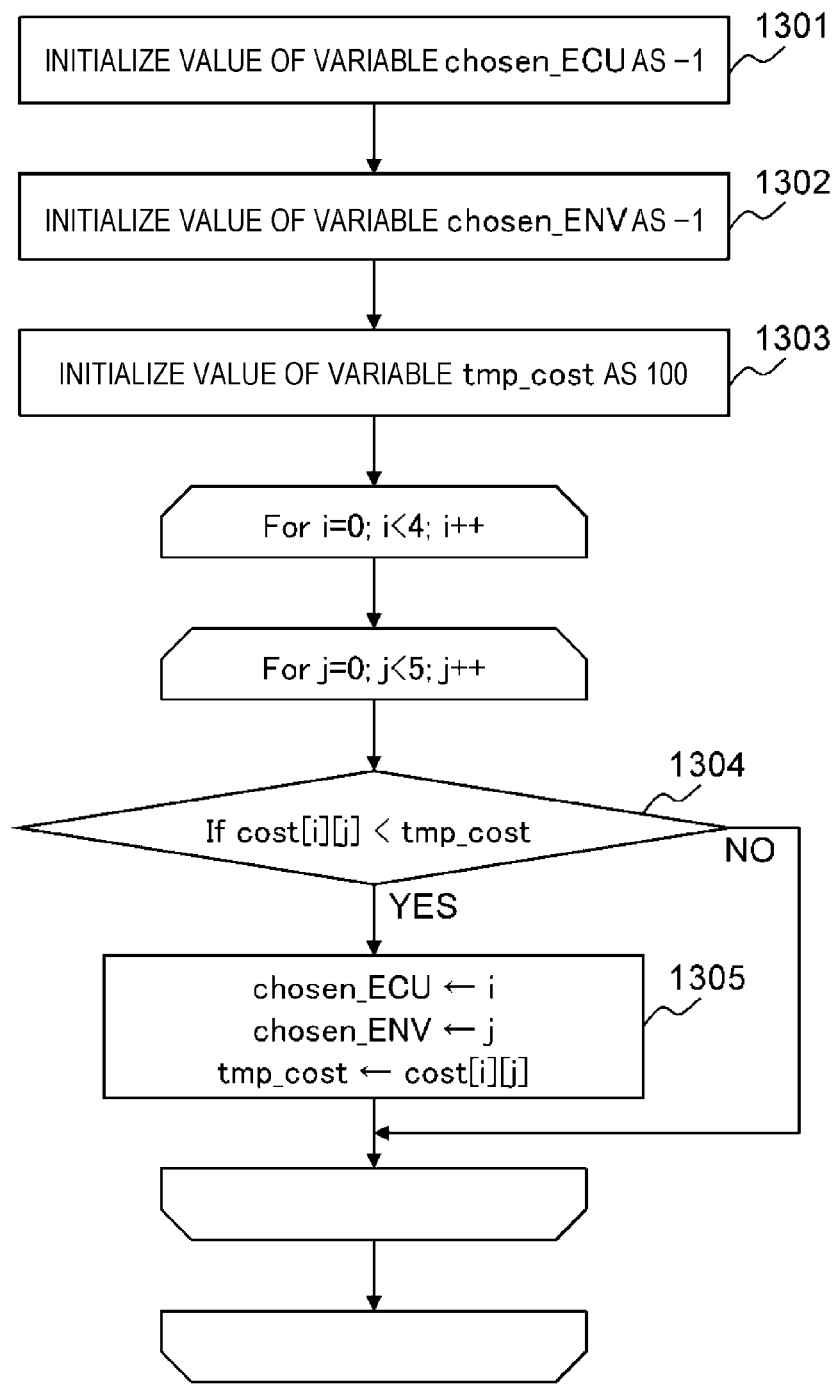
FIG. 13 is a flowchart of a process in which an environment selection unit determines one of the test targets and one of the test environments in the first embodiment.

FIG. 13 is a flowchart of a process in which the environment selection unit 10 determines one of the test targets and one of the test environments in the first embodiment.

First, a value of variable chosen_ECU is initialized as −1 (1301), a value of variable chosen_ENV is initialized as −1 (1302), and a value of variable tmp_cost is initialized as 100 (1303). Concerning the initial value of the variable tmp_cost that is 100, a maximum value of possible costs may be set because a minimum value of costs to be found in a loop will be recorded as the variable tmp_cost.

Thereafter, a value of cost[i][j] is compared with that of tmp_cost (1304). As a result, if the value of cost[i][j] is smaller than that of tmp_cost, with respect to a lowest-cost combination, the i-th ECU is recorded in the variable chosen_ECU, the j-th test environment is recorded in the variable chosen_ENV, and the value of cost[i][j] is recorded in the tmp_cost (1305).

After the decision of costs for all the combinations of the ECUs and the test environments is completed, an ECU and a test environment that need to be selected as a lowest-cost combination are stored in the variable chosen_ECU and the variable chosen_ENV, respectively. That is, a combination of a (chosen_ECU)-th ECU and a (chosen_ENV)-th test environment is best in terms of cost.

It should be noted that a predetermined number of combinations of test targets and test environments may be selected in low-cost order, instead of selecting one lowest-cost combination of a test target and a test environment. In this case, an interface (e.g. an input screen) may be provided to present the plurality of selected combinations of test targets and test environments to a user, so that the user can select a test target and a test environment for executing a test case.

As described above, according to the first embodiment of the present invention, it is possible to determine a combination of a test target and a test environment that are currently vacant while satisfying the target requirements 302 and the environment requirements 303. In addition, by setting the usage cost for the SiLSs to be lower than that for the HiLSs, when both a SiLS and a HiLS are vacant, allocation can be made preferentially to the SiLS. Accordingly, it is possible to prevent test cases from being detained in a specific HiLS having high simulation accuracy, thereby effectively using the test environments.

Second Embodiment

Figure 14:
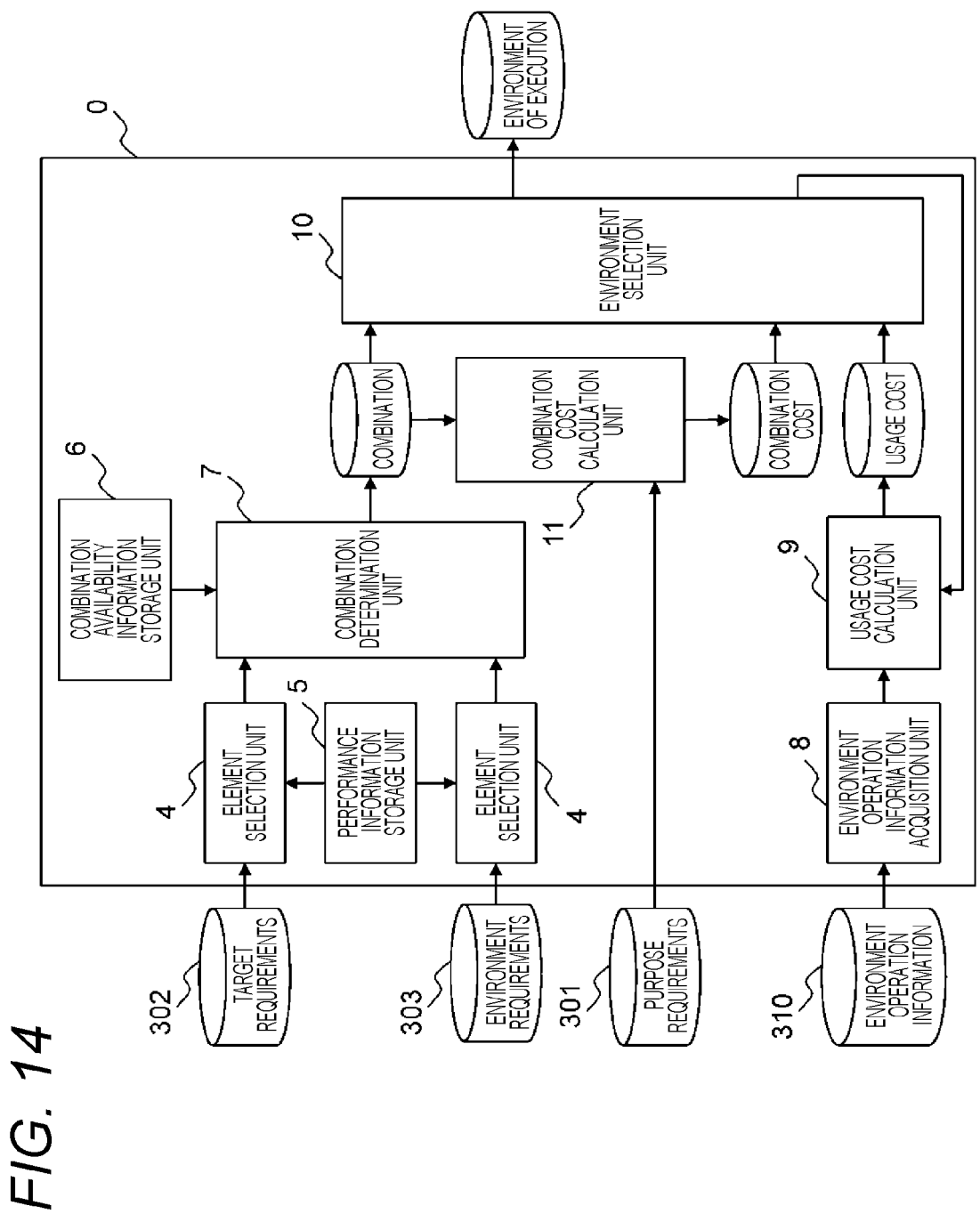
FIG. 14 is a diagram showing a configuration of a test environment determination device in a second embodiment.

A test environment determination device 0 according to a second embodiment of the present invention will be described. As shown in FIG. 14, the test environment determination device 0 in the second embodiment is different from that in the first embodiment in that purpose requirements 301 are added as an input to the test environment determination device 0, and a combination cost calculation unit 11 is added as a component of the test environment determination device 0. It should be noted that the second embodiment will be described mainly for the differences from the first embodiment, and the same reference numerals will be enclosed with the same components in the second embodiment as those in the first embodiment and the description thereof will be omitted.

In the first embodiment, a SiLS is preferentially selected over a HiLS among test environments that are not currently in operation when a combination is determined, but it depends on a calculation result of the environment selection unit 10 which test target, which test environment, or which test target and which test environment are selected. In addition thereto, the second embodiment is characterized in that a test target, a test environment, or both to be used can be directly specified as the purpose requirements 301.

According to the second embodiment, the present invention can be applied even when it is necessary to select a specific test target, a specific test environment, or both for reproducing a defective environment or the like.

<Test Specification Form 30>

Figure 15:
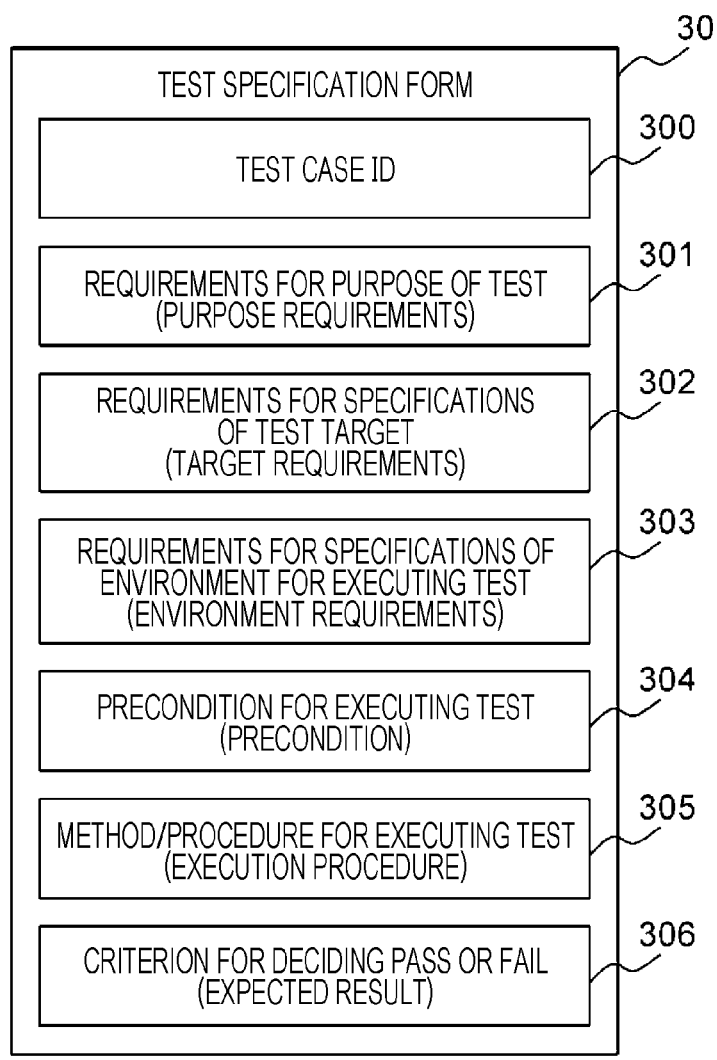
FIG. 15 is a diagram showing a format for a test specification form in the second embodiment.

FIG. 15 is a diagram showing a format for a test specification form 30 in the second embodiment. The test specification form 30 in the second embodiment includes a test case ID 300, purpose requirements 301, target requirements 302, environment requirements 303, a precondition 304, an execution procedure 305, and an expected result 306. The purpose requirements 301 added to the test specification form 30 in the second embodiment are requirements for directly specifying a test target, a test environment, or both to be used depending on a purpose of a test.

<Element Selection Unit 4>

The element selection unit 4 in the second embodiment is different from that in the first embodiment in that a value of ECU_choice[ ] is immediately determined when a test target is specified as the purpose requirement 301, and a value of ENV_choice[ ] is immediately determined when a test environment is specified as the purpose requirement 301.

Figure 16:
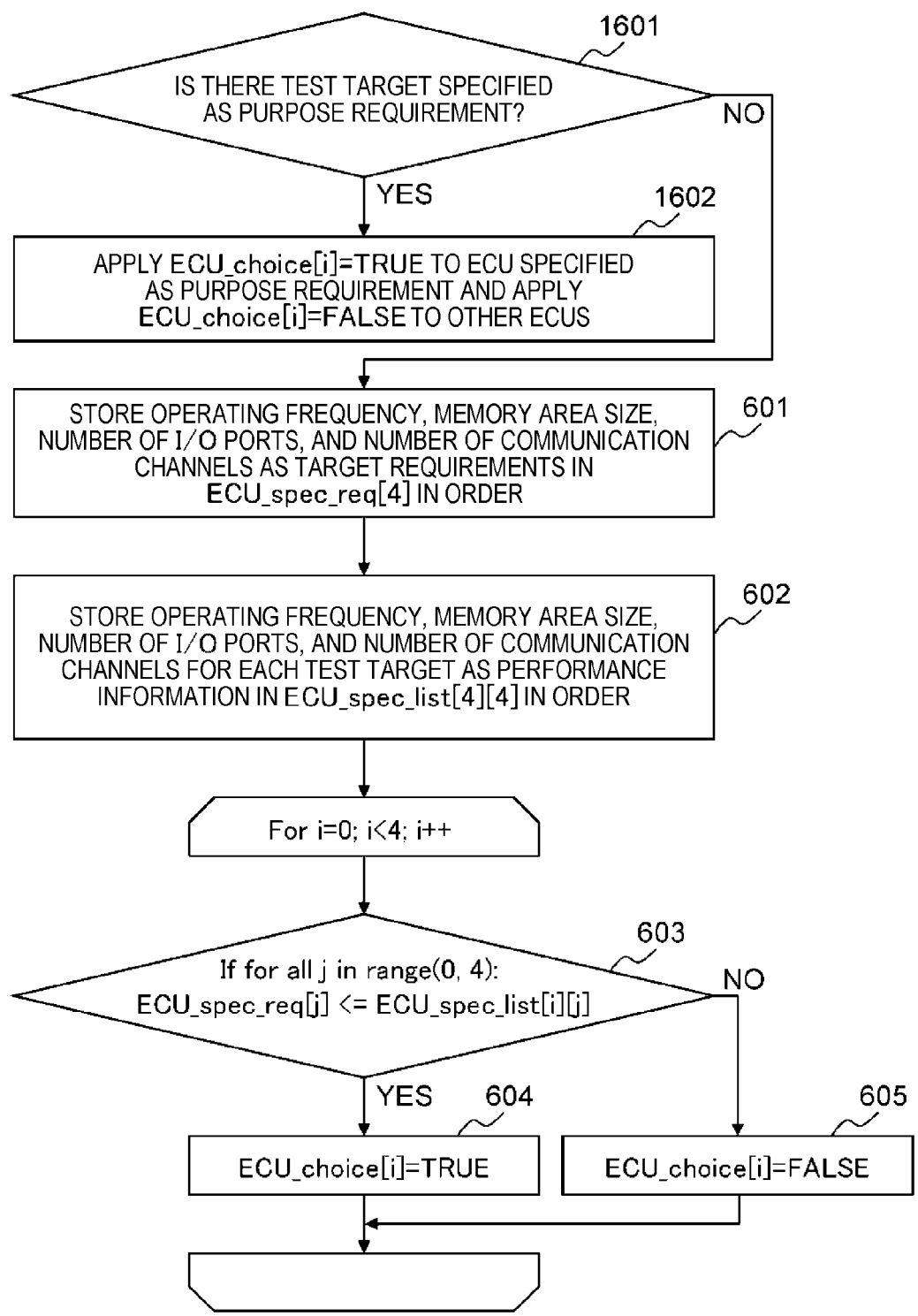
FIG. 16 is a flowchart of a process in which an element selection unit selects test targets based on purpose requirements, target requirements, and target performance information in the second embodiment.

FIG. 16 is a flowchart of a process in which the element selection unit 4 selects one or more selectable test targets based on the purpose requirements 301, the target requirements 302, and the target performance information 501 in the second embodiment. First, the element selection unit 4 decides whether there is a test target specified as the purpose requirement 301 (1601). As a result, if there is no test target specified as the purpose requirement 301, the process proceeds to step 601. The process in and after step 601 is the same as that by the element selection unit 4 in the first embodiment described above (FIG. 6). On the other hand, if there is a test target specified as the purpose requirement 301, ECU_choice[i] for the ECU specified as the purpose requirement 301 is TRUE, and ECU_choice[i] for the other ECUs is FALSE (1602).

Figure 17:
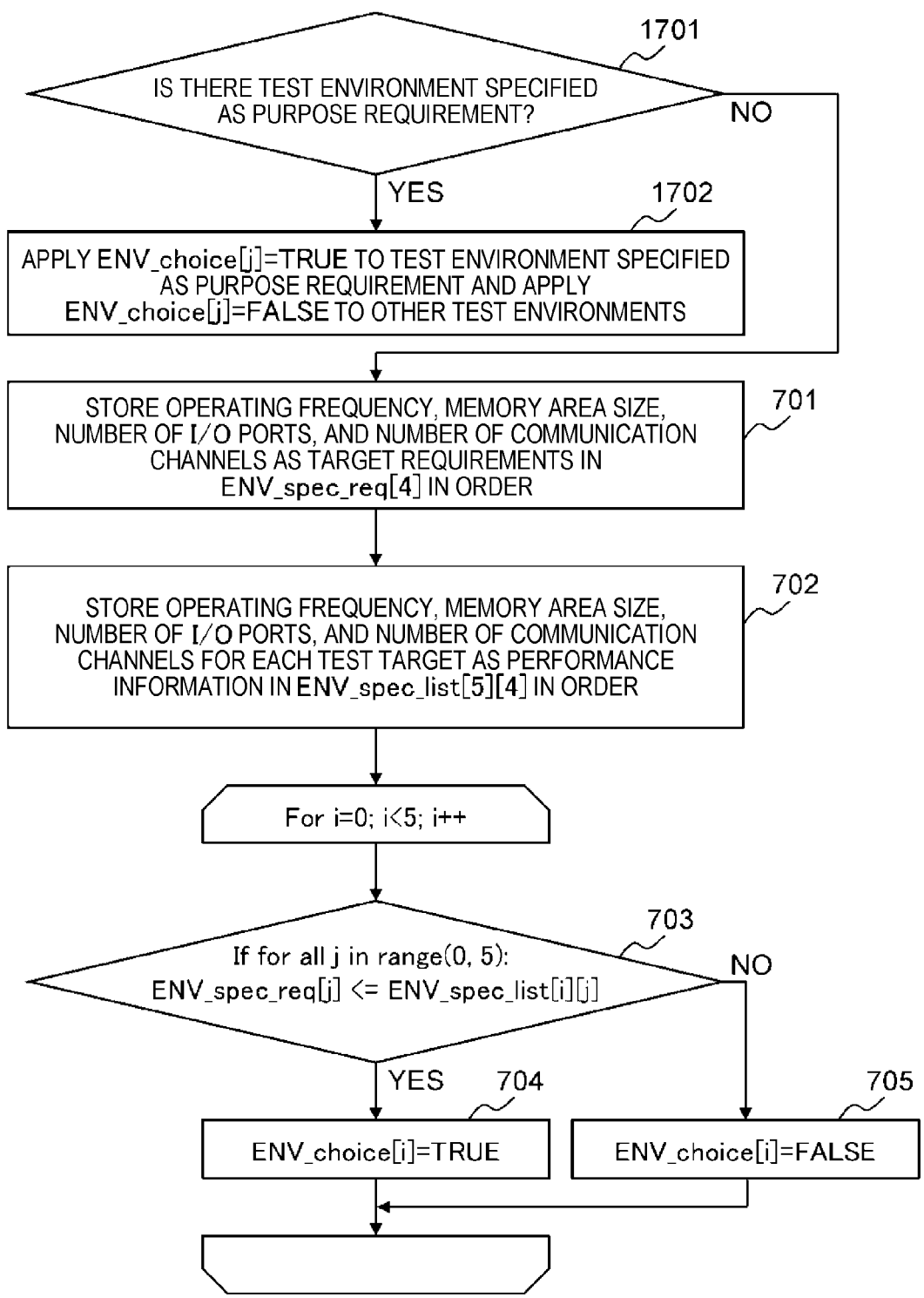
FIG. 17 is a flowchart of a process in which the element selection unit selects test environments based on environment requirements and environment performance information in the second embodiment.

FIG. 17 is a flowchart of a process in which the element selection unit 4 selects one or more selectable test environments based on the environment requirements 303 and the environment performance information 502 in the second embodiment. First, the element selection unit 4 decides whether there is a test environment specified as the purpose requirement 301 (1701). As a result, if there is no test environment specified as the purpose requirement 301, the process proceeds to step 701. The process in and after step 701 is the same as that by the element selection unit 4 in the first embodiment described above (FIG. 7). On the other hand, if there is a test environment specified as the purpose requirement 301, ENV_choice[j] for the test environment specified as the purpose requirement 301 is TRUE, and ENV_choice[j] for the other test environments is FALSE (1702).

<Usage Cost Calculation Unit 9>

The usage cost calculation unit 9 in the second embodiment is different from that in the first embodiment in that a value of ECU_IsVacant[i] and/or a value of ENV_IsVacant[j] is TRUE for the test target, the test environment, or both specified as the purpose requirements 301, regardless of whether they are actually in a vacant state.

Figure 18:
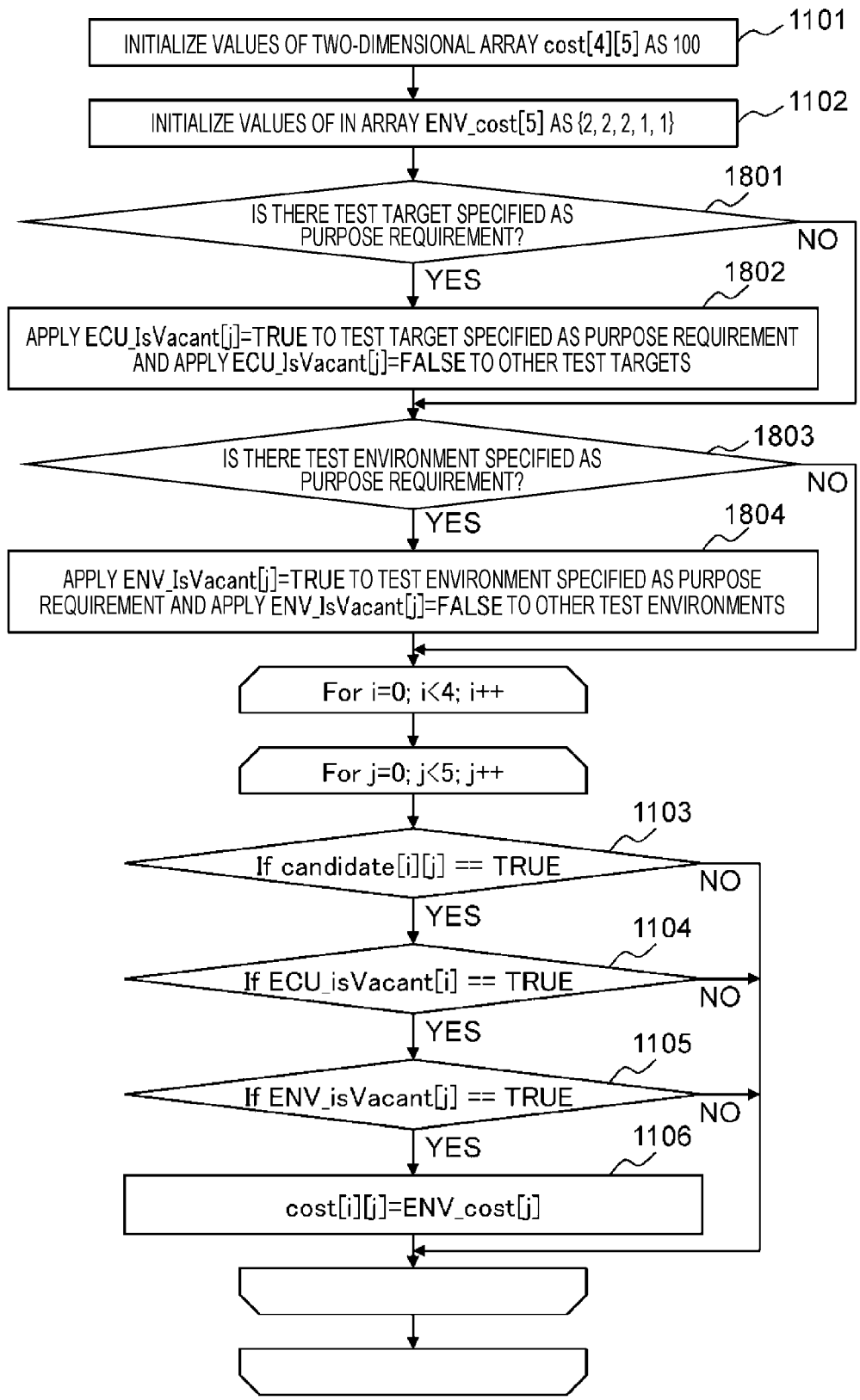
FIG. 18 is a flowchart of a process in which a usage cost calculation unit calculates usage costs in the second embodiment.

FIG. 18 is a flowchart of a process in which the usage cost calculation unit 9 calculates usage costs in the second embodiment. It should be noted that the process in steps 1101 and 1102 and in and after steps 1103 is the same as that by the usage cost calculation unit 9 described above (FIG. 11).

First, the usage cost calculation unit 9 initializes values of cost[4][5] as 100 (1101), and stores costs for the test environments in array ENV_cost[5] with 5 elements as 2, 2, 2, 1, and 1 in order (1102).

Thereafter, it is decided whether there is a test target specified as the purpose requirement 301 (1801). As a result, if there is no test target specified as the purpose requirement 301, the process proceeds to step 1803. On the other hand, if there is a test target specified as the purpose requirement 301, ECU_IsVacant[j] for the test target specified as the purpose requirement 301 is TRUE, and ECU_IsVacant[j] for the other test targets is FALSE (1802).

Thereafter, it is decided whether there is a test environment specified as the purpose requirement 301 (1803). As a result, if there is no test environment specified as the purpose requirement 301, the process skips step 1804 and enters the loop. On the other hand, if there is a test environment specified as the purpose requirement 301, ENV_IsVacant[j] for the test environment specified as the purpose requirement 301 is TRUE, and ENV_IsVacant[j] for the other test environments is FALSE (1804).

Thereafter, the process in and after step 1103 is executed.

As described above, according to the second embodiment of the present invention, it is possible to determine a combination of a test target and a test environment that are currently vacant while satisfying the target requirements 302 and the environment requirements 303, and it is also possible to directly specify a test target, a test environment, or both to be used as purpose requirements 301.

Third Embodiment

A test environment determination device 0 according to a third embodiment of the present invention will be described. The third embodiment is different from the first embodiment in that, with respect to one or more selectable combinations of test targets and test environments output by the combination determination unit 7, the environment selection unit 10 determines a combination of a test target and a test environment considering the scheduling of the test targets and the test environments. It should be noted that the third embodiment will be described mainly for the differences from the first and second embodiments, and the same reference numerals will be enclosed with the same components in the third embodiment as those in the first and second embodiments and the description thereof will be omitted.

<Usage Cost Calculation Unit 9>

The usage cost calculation unit 9 in the third embodiment does not give ENV_cost [5], which indicates a cost for each of the test environments, in advance as in the first embodiment, but estimates a required time period for executing a test from the start of the execution to the end of the execution and a waiting time period until the execution of the test is started based on the operation information on each of the test environments, and gives the cost as a sum of the estimated required time period for execution and the estimated waiting time period.

The required time period for execution can be estimated by the following method. The usage cost calculation unit 9 analyzes the operation information on the environments acquired by the environment operation information acquisition unit 8, and if a record of a test case executed for the same test target in the same test environment in the past is found, a required time period for executing the test case is calculated by subtracting an execution start time from an execution end time. If there are multiple execution records, the required time period for execution may be an arithmetic mean of respective required time periods for execution in the multiple execution records. If there is no record, a time period obtained by adding the number of steps of the test case×1 [minute] to a total waiting time period according to wait commands included in the test case may be substituted.

The waiting time period can be estimated by the following method. Based on information on a test target and a test environment allocated to each test case and an allocation time, the occupied status of each test target and each test environment can be calculated. For example, the scheduling of the test targets and the test environments is determined according to the following rules. (1) With respect to a test target and a test environment to which another preceding test case is allocated, a time zone to which the allocation has been completed is not changed. (2) An ECU and a HiLS are occupied in the same time zone. (3) A test is executed in a vacant time zone that is equal to or longer than the required time period for execution while being closest to a current time.

Figure 19:
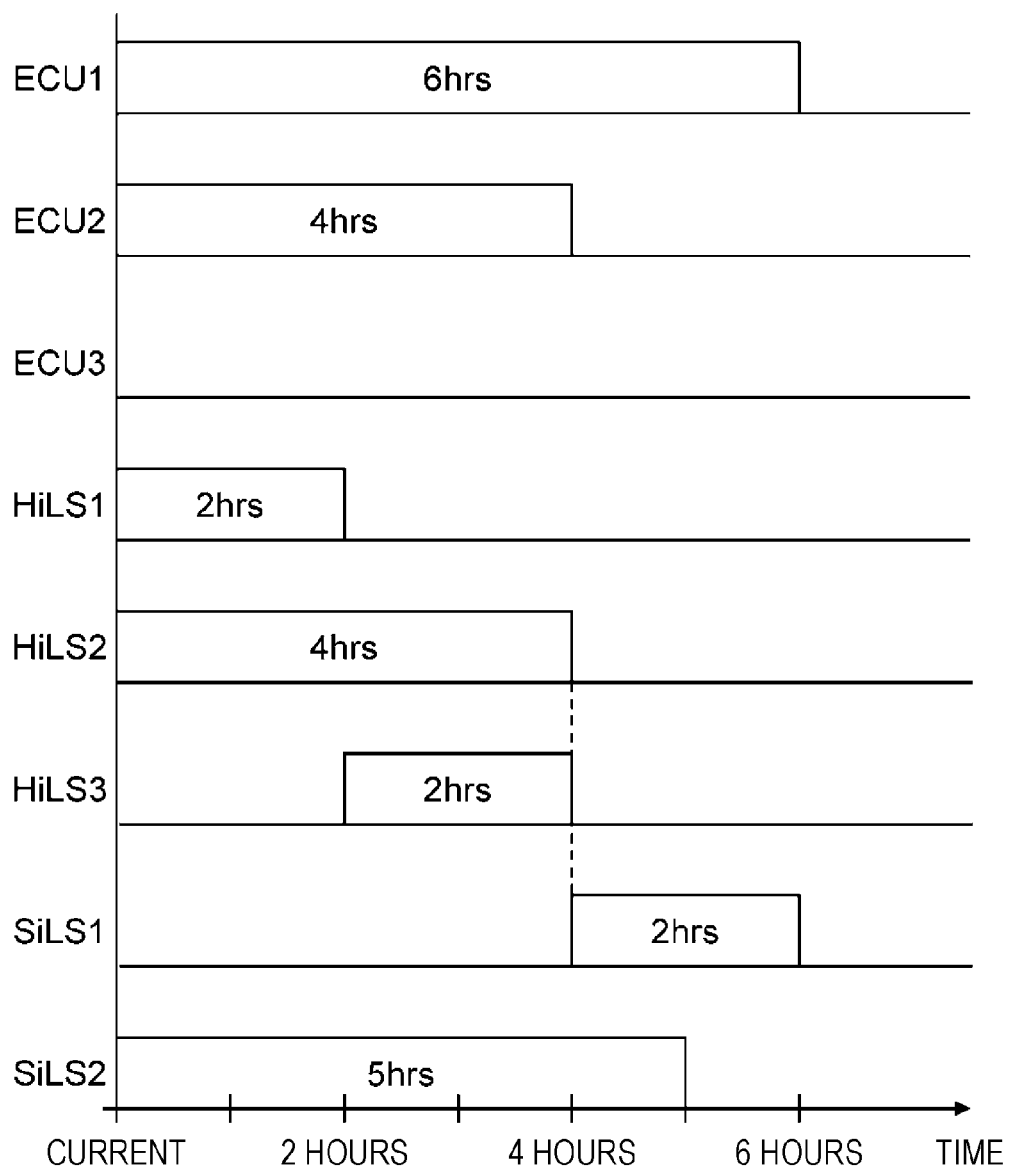
FIG. 19 is a diagram showing an example of the status of test environments occupied by test targets in a third embodiment.

FIG. 19 is a diagram showing an example of the status of the test environments occupied by the test targets in the third embodiment. For example, in FIG. 19, when a required time for executing a test case with a combination of ECU3 and HiLS3 is 1 hour, a vacant time period is searched from the current time and a time period for execution is allocated to the vacant time period. In this case, the waiting time period is 0, resulting in a cost ENV_cost[3][2]=0+1=1.

In addition, since another preceding test case is executed in HiLS3 for 2 hours from 2 hours after the current time, if a test case requiring 3 hours for execution with the combination of ECU3 and HiLS3 is executed from the current time, the test case is not completed until the start time of the preceding test case. For this reason, HiLS3 can be used after the preceding test case is completed. Therefore, the waiting time period is 4 hours, resulting in cost ENV_cost[3][2]=4+3=7.

It should be noted that, in order to prevent test cases from being detained in a specific HiLS having high simulation accuracy, when the test environment is a HiLS, a penalty time period may be set depending on a test target or a test environment by, for example, adding 2 hours to the cost calculated by the above-described method (the sum of the required time period for execution and the waiting time period). In addition, at the time of scheduling, the estimated required time period for execution may be multiplied by a constant, or a spare time period may be set between executions of test cases.

As described above, according to the third embodiment of the present invention, a test case is allocated to a combination requiring a shortest time period until the execution of the test case is completed among combinations of test targets and test environments satisfying the combination availability information based on the target requirements 302 and the environment requirements 303. Accordingly, it is possible to shorten a time period taken until each test case is completed and it is possible to effectively utilize limited resources of test targets and test environments, thereby improving a throughput in executing test cases.

Fourth Embodiment

A test environment determination device 0 according to a fourth embodiment of the present invention will be described. In the fourth embodiment, unlike the first embodiment, when the combination determination unit 7 fails to find any selectable combination of a test target and a test environment, the target requirements 302, the environment requirements 303, or both are relaxed, so that a selectable combination of a test target and a test environment may be found. It should be noted that the fourth embodiment will be described mainly for the differences from the first to third embodiments, and the same reference numerals will be enclosed with the same components in the fourth embodiment as those in the first to third embodiments and the description thereof will be omitted.

In the test environment determination device 0, an interface (e.g. an input screen) may be provided to allow the user to input target requirements 302 and environment requirements 303. It should be noted that a combination of a test target and a test environment having a small deviation from the current target requirements 302 and environment requirements 303 may be presented to the user, and the user may be urged to input relaxed target requirements 302 and environment requirements 303.

According to the fourth embodiment of the present invention, a combination of a test target and a test environment can be allocated to any test case, thereby making it possible to increase the opportunity to allocate a combination of a test target and a test environment.

As described above, according to the embodiments of the present invention, an appropriate test environment can be selected while preventing test cases from being detained therein, by means of the element selection unit 4 that selects one or more test targets and one or more test environments for executing a test case based on the target requirements 302 described for the specifications of an electronic control unit (ECU3), which is a test target, and the environment requirements 303 described for the specifications of a test environment (HiLS1 or SiLS2) for simulating an external environment of the test target, the environment operation information acquisition unit 8 that acquires operation information on the test environments, and the environment selection unit 10 that selects a combination of the selected test target and the selected test environment based on the acquired operation information.

In addition, since the element selection unit 4 selects test targets to satisfy a lower limit value or a range of at least one of an operating frequency, a memory area, the number of I/O ports, and the number of communication channels specified as the target requirements 302, and selects test environments to satisfy a lower limit value or a range of at least one of an operating frequency, a memory area, the number of I/O ports, and the number of communication channels specified as the environment requirements 303, it is possible to accurately select whether a tested device can be used.

In addition, since the environment operation information acquisition unit 8 acquires an operation history, including execution start times and execution end times of test cases executed for the test targets in test environments, as the operation information, the operation status of the test environments can be observed, and priorities of test cases to be executed can be determined according to the end times of the test cases.

In addition, since the environment selection unit 10 selects a combination of a non-operating test target and a non-operating test environment decided based on the acquired operation history, a test case can be executed even when the test case is desired to be executed immediately, thereby improving an operating rate of the test environments.

In addition, since the environment selection unit 10 selects a combination of a test target and a test environment enabling the test case to be executed in a time zone closest to the current time while securing a time period required for executing the test case, it is possible to shorten a time period taken until the test case is completed by selecting a combination enabling the test case to be completed at the earliest time, thereby improving a throughput in executing test cases and improving an operating rate of the test environments.

In addition, since the interface is included to specify at least one of a test target and a test environment different from the test targets and the test environments selected by the element selection unit 4 for executing the test case, a test target and/or a test environment to be used can be directly specified as purpose requirements 301. Thus, the test can be performed again in the same environment. For example, the test can be performed again in the same environment after correcting a defect.

In addition, since the interface is included to change at least one of the target requirements 302 and the environment requirements 303 when there is no combination of a test target and a test environment satisfying the target requirements 302 and the environment requirements 303, a combination of a test target and a test environment can be allocated to any test case, thereby making it possible to increase the opportunity to allocate a combination of a test target and a test environment.

It should be noted that the present invention is not limited to the above-described embodiments, and encompasses various modifications and equivalents within the scope of the appended claims. For example, the above-described embodiments have been described in detail in order to explain the present invention in an easy-to-understand manner, and the present invention is not necessarily limited to having all the configurations described above. In addition, a part of the configuration of one embodiment may be replaced with that of the configuration of another embodiment. In addition, the configuration of one embodiment may be added to the configuration of another embodiment. In addition, with respect to a part of the configuration of each embodiment, addition of another configuration, deletion, or replacement with another configuration may be performed.

In addition, each of the above-described configurations, functions, processing units, processing means, and the like may be implemented by hardware, for example, by designing an integrated circuit for a part or all thereof, or may be implemented by software by interpreting and executing a program for implementing each of the functions through a processor.

Information such as programs, tables, and files for implementing the respective functions can be stored in a storage device such as a memory, a hard disk, or a solid state drive (SSD), or a recording medium such as an IC card, an SD card, or a DVD.

In addition, control lines and information lines which are considered to be necessary for the explanation are illustrated, but not all the control lines and information lines which are necessary in terms of implementation are illustrated. In practice, it may be considered that almost all configurations are interconnected.

REFERENCE SIGNS LIST 0 test environment determination device
1 HiLS environment
2 SiLS environment
3 ECU
4 element selection unit
5 performance information storage unit
6 combination availability information storage unit
7 combination determination unit
8 environment operation information acquisition unit
9 usage cost calculation unit
10 environment selection unit
11 combination cost calculation unit
30 test specification form
101 HiLS control computer
102 HiLS
104 communication path between 101 and 102
105 communication path or wire between 102 and 103
201 SiLS control computer
300 test case ID
301 purpose requirements
302 target requirements
303 environment requirements
304 precondition
305 execution procedure
306 expected result
501 target performance information
502 environment performance information
801 combination availability table
2011 simulation of ECU on software
2012 simulation of external environment of ECU on software
3101 operation information on HiLS1
3102 operation information on HiLS2
3103 operation information on HiLS3
3104 operation information on SiLS1
3105 operation information on SiLS2

The invention claimed is:

1. A test environment determination device, comprising:
an element selection unit that selects one or more test targets and one or more test environments for executing a test case based on target requirements described for specifications of an electronic control unit (ECU), which is a test target, and environment requirements described for specifications of a test environment for simulating an external environment of the test target;
an environment operation information acquisition unit that acquires operation information on the test environments;
a usage cost calculation unit that sets hardware-in-the-loop environment cost values and software-in-the-loop environment cost values; and
an environment selection unit that selects a combination of the selected test target and the selected test environment based on the acquired operation information, the hardware-in-the-loop environment cost values and the software-in-the-loop environment cost values, wherein the one or more test environments comprise a hardware-in-the-loop environment and a software-in-the-loop environment.

2. The test environment determination device according to claim 1, wherein the element selection unit:
selects test targets to satisfy a lower limit value or a range of at least one of an operating frequency, a memory area, a number of I/O ports, and a number of communication channels specified as the target requirements, and
selects test environments to satisfy a lower limit value or a range of at least one of an operating frequency, a memory area, the number of I/O ports, and the number of communication channels specified as the environment requirements.

3. The test environment determination device according to claim 1, wherein the environment operation information acquisition unit acquires an operation history, including execution start times and execution end times of test cases executed for the test targets in the test environments, as the operation information.

4. The test environment determination device according to claim 3, wherein the environment selection unit selects a combination of a non-operating test target and a non-operating test environment decided based on the acquired operation information.

5. The test environment determination device according to claim 1, wherein the environment selection unit selects the combination of the test target and the test environment enabling the test case to be executed in a time zone closest to a current time while securing a time period required for executing the test case.

6. The test environment determination device according to claim 1, comprising an interface for specifying at least one of a test target and a test environment different from the test targets and the test environments selected by the element selection unit to execute a test case.

7. The test environment determination device according to claim 1, comprising an interface for changing at least one of the target requirements and the environment requirements when there is no combination of a test target and a test environment satisfying the target requirements and the environment requirements.

8. A test environment determination method for a computer to select a combination of a test target and a test environment suitable for executing a test case, the computer including an arithmetic device that executes a program and a storage device that can accept access from the arithmetic device, the test environment determination method comprising:
an element selecting step of selecting, by the arithmetic device, one or more test targets and one or more test environments for executing a test case based on target requirements described for specifications of an electronic control unit, which is a test target, and environment requirements described for specifications of a test environment for simulating an external environment of the test target;
an environment operation information acquiring step of acquiring, by the arithmetic device, operation information on the test environments;
a usage cost calculation step of setting hardware-in-the-loop environment cost values and software-in-the-loop environment cost values; and
an environment selecting step of selecting, by the arithmetic device, a combination of the selected test target and the selected test environment based on the acquired operation information, the hardware-in-the-loop environment cost values and the software-in-the-loop environment cost values, wherein the test environment comprises a hardware-in-the-loop environment and a software-in-the-loop environment.

9. The test environment determination method according to claim 8, wherein in the element selecting step, the arithmetic device selects test targets to satisfy a lower limit value or a range of at least one of an operating frequency, a memory area, a number of I/O ports, and a number of communication channels specified as the target requirements, and the arithmetic device selects test environments to satisfy a lower limit value or a range of at least one of an operating frequency, a memory area, the number of I/O ports, and the number of communication channels specified as the environment requirements.

10. The test environment determination method according to claim 8, wherein in the environment operation information acquiring step, the arithmetic device acquires an operation history, including execution start times and execution end times of test cases executed for the test targets in the test environments, as the operation information.

11. The test environment determination method according to claim 10, wherein in the environment selecting step, the arithmetic device selects a combination of a non-operating test target and a non-operating test environment decided based on the acquired operation information.

12. The test environment determination method according to claim 8, wherein in the environment selecting step, the arithmetic device selects the combination of the test target and the test environment enabling the test case to be executed in a time zone closest to a current time while securing a time period required for executing the test case.

13. The test environment determination method according to claim 8, wherein the arithmetic device accepts specifying at least one of a test target and a test environment different from the test targets and the test environments selected in the element selecting step to execute the test case.

14. The test environment determination method according to claim 8, wherein the arithmetic device accepts changing at least one of the target requirements and the environment requirements when there is no combination of a test target and a test environment satisfying the target requirements and the environment requirements.

* * * * *